US012652366B1

(12) United States Patent
Zhou

(10) Patent No.: US 12,652,366 B1
(45) Date of Patent: Jun. 9, 2026

(54) DRIVING RECORDER AND VEHICLE

(71) Applicant: Shenzhen 360 Smart Life Technology Co., Ltd., Shenzhen (CN)

(72) Inventor: Weijie Zhou, Shenzhen (CN)

(73) Assignee: Shenzhen 360 Smart Life Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/984,969

(22) Filed: Dec. 17, 2024

Related U.S. Application Data

(63) Continuation of application No. PCT/CN2024/139284, filed on Dec. 13, 2024.

(30) Foreign Application Priority Data

Dec. 9, 2024 (CN) .......................... 202423032418.9

(51) Int. Cl.
| | |
|---|---|
| *H04N 5/77* | (2006.01) |
| *H04N 23/57* | (2023.01) |
| *H05K 1/181* | (2026.01) |
| *H05K 7/14* | (2006.01) |

(52) U.S. Cl.
CPC .............. *H04N 5/77* (2013.01); *H04N 23/57* (2023.01); *H05K 1/181* (2013.01); *H05K 7/1427* (2013.01); *H05K 2201/10121* (2013.01)

(58) Field of Classification Search
CPC .......... H04N 5/77; H04N 23/57; H05K 1/181; H05K 7/1427; H05K 2201/10121
USPC ........................................................ 348/148
See application file for complete search history.

(56) References Cited

U.S. PATENT DOCUMENTS

| | | | | |
|---|---|---|---|---|
| 9,426,339 B2 * | 8/2016 | Pacurariu | ............... | H04N 23/66 |
| 10,359,516 B2 * | 7/2019 | Liu | ........................ | H04N 5/04 |
| 10,768,508 B1 * | 9/2020 | Woodman | ................ | G03B 7/26 |
| 2007/0053682 A1 * | 3/2007 | Chang | ................. | H04M 1/0264 |
| | | | | 348/E5.026 |
| 2016/0381292 A1 * | 12/2016 | Lu | ........................ | B60R 11/0235 |
| | | | | 348/36 |
| 2018/0329059 A1 | 11/2018 | Liu et al. | | |

FOREIGN PATENT DOCUMENTS

| | | |
|---|---|---|
| CN | 207115515 U | 3/2018 |
| CN | 207216710 U | 4/2018 |
| TW | M628646 U | 6/2022 |

OTHER PUBLICATIONS

International Search Report and Written Opinion issued in corresponding PCT Application No. PCT/CN2024/139284, dated Aug. 29, 2025.

* cited by examiner

*Primary Examiner* — John W Miller
*Assistant Examiner* — Omer Khalid
(74) *Attorney, Agent, or Firm* — Westbridge IP LLC

(57) ABSTRACT

A driving recorder includes a main body and an expansion component. The main body includes a housing, a main circuit board and a main camera. The main circuit board is provided within the housing, the main camera is provided at a surface of the housing, and the main camera is electrically connected to the main circuit board. The expansion component includes a base, an expansion circuit board and an expansion camera. The expansion circuit board is provided within the base, the expansion camera is provided at the base, and the expansion camera is electrically connected to the expansion circuit board.

9 Claims, 5 Drawing Sheets

100

2

22

221

21

DRIVING RECORDER AND VEHICLE

CROSS-REFERENCE TO RELATED APPLICATIONS

The present application is a continuation application of International Application No. PCT/CN2024/139284, filed on Dec. 13, 2024, which claims priority to Chinese Patent Application No. 202423032418.9, filed on Dec. 9, 2024. The disclosures of the above-mentioned applications are incorporated herein by reference in their entireties.

TECHNICAL FIELD

The present application relates to the technical field of vehicle-mounted devices, and in particular to a driving recorder and a vehicle.

BACKGROUND

A driving recorder is an instrument that records images, sounds and other related information while a vehicle is driving. After installing a driving recorder, video images and sounds of the entire driving process can be recorded, which can provide evidence for traffic accidents. The driving recorder can also capture the beautiful scenery while the car is driving and record the process of conquering difficulties and obstacles.

Most of the common driving recorders on the market have a single usage mode and cannot be adjusted according to the actual usage scenario, making them not flexible enough.

SUMMARY

The objective of the present application is to provide a driving recorder and a vehicle, which aims to be flexibly expandable according to usage scenarios to adapt to different usage scenarios.

In order to achieve the above objectives, the driving recorder provided by the present application includes: a main body and an expansion component. The main body includes: a housing, a main circuit board, and a main camera. The main circuit board is provided within the housing, the main camera is provided at a surface of the housing, and the main camera is electrically connected to the main circuit board. The expansion component includes: a base, an expansion circuit board, and an expansion camera. The expansion circuit board is provided within the base, the expansion camera is provided at the base and electrically connected to the expansion circuit board. One of the main circuit board and the expansion circuit board is provided with an expansion interface, another one of the main circuit board and the expansion circuit board is provided with an expansion connector, and the expansion connector is detachably and electrically connected to the expansion interface to detachably connect the expansion component to the main body and to electrically connect the expansion circuit board to the main circuit board.

In an embodiment, the main body further includes a first magnetic member provided at an inner wall of the housing facing the expansion component; the expansion component further includes a second magnetic member provided at an inner wall of the base facing the main body, the first magnetic member is magnetically connected to the second magnetic member to detachably connect the housing and the base.

In an embodiment, the main body includes two first magnetic members, the expansion component includes two second magnetic members, and the two first magnetic members or the two second magnetic members are spaced apart on opposite sides of the expansion interface or the expansion connector.

In an embodiment, a slot is provided at a surface of one of the housing and the base, a plug-in part is provided at another one of the housing and the base, and the plug-in part is detachably connected to the slot to detachably connect the housing and the base.

In an embodiment, the driving recorder includes two expansion components, and the two plug-in parts or the two slots are symmetrically provided at opposite sides of the expansion interface or the expansion connector.

In an embodiment, the expansion camera is rotatably connected to the base, and when the expansion component is installed on the main body, the expansion camera rotates horizontally relative to the base.

In an embodiment, rotating shafts are provided at two opposite sides of one of the base and the expansion camera, axial holes are provided at two opposite sides of another one of the base and the expansion camera, one of the rotating shafts passes through one of the axial holes so that the expansion camera rotates relative to the base perpendicular to an extension direction of the rotating shaft.

In an embodiment, the quantity of expansion components is two, and the two expansion components are symmetrically provided at opposite sides of the main body.

In an embodiment, the expansion interface is a Type-C interface and the expansion connector is a Type-C connector.

The present application further provides a vehicle, including the driving recorder described above, the expansion interface is a Type-C interface, and the expansion connector is a Type-C connector.

In the technical solution of the present application, an expansion interface is provided at one of the main body and the expansion component, and an expansion connector is provided at the other. The expansion interface and the expansion connector are electrically connected to the main circuit board or the expansion circuit board at the corresponding position respectively. The detachable electrical connection between the expansion interface and the expansion connector can realize the detachable electrical connection between the expansion circuit board and the main circuit board, and can also realize the detachable connection between the expansion component and the main body. It is possible to flexibly choose whether to connect the expansion component according to the usage scenario, thereby improving the flexibility of using the driving recorder.

BRIEF DESCRIPTION OF THE DRAWINGS

In order to more clearly illustrate the technical solutions in the embodiments of the present disclosure or in the related art, drawings used in the embodiments or in the related art will be briefly described below. Obviously, the drawings in the following description are only some embodiments of the present disclosure. It will be apparent to those skilled in the art that other figures can be obtained according to the structures shown in the drawings without creative work.

DETAILED DESCRIPTION OF THE EMBODIMENTS

Figure 1:
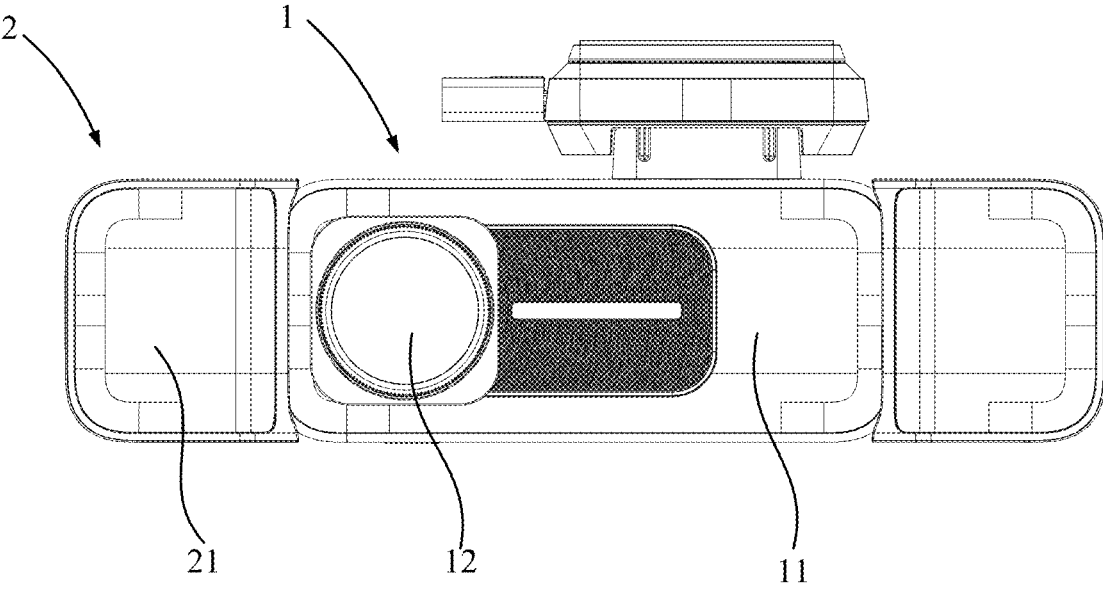
FIG. 1 is a schematic structural diagram of a driving recorder according to an embodiment of the present application.

The technical solutions in the embodiments of the present application will be clearly and completely described below with reference to the drawings in the embodiment of the present application. Obviously, the described embodiments are only a part of the embodiments of the present application, not all of the embodiments. Based on the embodiments in the present application, all other embodiments perceived by those skilled in the art without creative effort should be fallen within the protection scope of the present application.

It should be noted that all of the directional instructions in the embodiments of the present application (such as, up, down, left, right, front, rear . . . ) are only used to explain the relative position relationship and movement of each component under a specific attitude (as shown in the drawings), if the specific attitude changes, the directional instructions will change correspondingly.

Besides, the descriptions in the present application that refer to "first", "second", etc. are only for descriptive purposes and are not to be interpreted as indicating or implying relative importance or to implicitly indicate the quantity of technical features indicated. Thus, a feature defined as "first" or "second" may explicitly or implicitly include at least one of the features. In addition, the meaning of "and/or" appearing in the entire text is to include three parallel solutions. For example, "A and/or B" includes only A, or only B, or both A and B. In addition, technical solutions between the embodiments can be combined with each other, but must be based on the realization of the technical solutions by those skilled in the art, and when the technical solutions are contradictory to each other or cannot be realized, the technical solutions should be considered that the combination does not exist, and the technical solutions are not fallen within the protection scope claimed in the present application.

A driving recorder is an instrument that records images, sounds and other related information while a vehicle is driving. After installing a driving recorder, video images and sounds of the entire driving process can be recorded, which can provide evidence for traffic accidents. The driving recorder can also capture the beautiful scenery while the car is driving and record the process of conquering difficulties and obstacles.

Most of the common driving recorders on the market have a single usage mode and cannot be adjusted according to the actual usage scenario, making them not flexible enough.

The present application proposes a driving recorder and a vehicle, which are designed to be flexibly expandable according to usage scenarios to adapt to different usage scenarios.

As shown in FIG. 1 to FIG. 5, in an embodiment of the present application, the driving recorder 100 includes a main body 1 and an expansion component 2. The main body 1 includes a housing 11, a main circuit board and a main camera 12. The main circuit board is provided within the housing 11, the main camera 12 is provided at a surface of the housing 11, and the main camera 12 is electrically connected to the main circuit board. The expansion component 2 includes a base 21, an expansion circuit board and an expansion camera 22. The expansion circuit board is provided within the base 21, the expansion camera 22 is provided at the base 21, and the expansion camera 22 is electrically connected to the expansion circuit board. One of the main circuit board and the expansion circuit board is provided with an expansion interface 13, and the other is provided with an expansion connector 23. The expansion connector 23 is detachably and electrically connected to the expansion interface 13, so that the expansion component 2 is detachably connected to the main body 1, and the expansion circuit board is electrically conductive to the main circuit board.

In this embodiment, the main body 1 of the driving recorder 100 includes a housing 11, a main circuit board and a main camera 12. The housing 11 can be made of hard plastic material, which is strong, durable, and light, so that it is easy to install in the car. The housing 11 can also be made of light metal material. The main circuit board is provided within the housing 11, and the main circuit board can be a printed circuit board (PCB) or other types of circuit boards. The expansion component 2 includes a base 21, an extension circuit board and an expansion camera 22, and the extension circuit board is provided within the base 21, and the extension circuit board can be a PCB board or other types of circuit boards. An expansion connector 23 is provided at the main circuit board, and the expansion connector 23 is electrically connected to the main circuit board and partially exposed from the housing 11. The expansion connector 23 can be a universal serial bus (USB) connector, or a Type-C connector or a mini-USB connector, which is not further limited here; accordingly, an expansion interface 13 is provided at the extension circuit board, and the expansion interface 13 is electrically connected to the extension circuit board and partially exposed from the base 21. The expansion interface 13 can be a USB interface, or a Type-C interface or a mini-USB interface. It can be understood that, in another embodiment, an expansion interface 13 is provided at the main circuit board, the expansion interface 13 is electrically connected to the main circuit board, and is partially exposed on the housing 11, and the expansion interface 13 can adopt a USB interface, and can also adopt a Type-C interface or a mini-USB interface, which is not further limited here. Accordingly, an expansion connector 23 is provided at the expansion circuit board, the expansion connector 23 is electrically connected to the expansion circuit board, and is partially exposed on the base 21. The expansion connector 23 can adopt a USB connector, and can also adopt a Type-C connector or a mini-USB connector, which is not further limited here.

By plugging the expansion interface 13 and the expansion connector 23, the connection between the housing 11 and the base 21 is realized, and then the connection between the expansion component 2 and the main body 1 is realized, and the electrical connection between the expansion circuit board and the main circuit board is realized through the electrical connection between the expansion connector 23 and the expansion interface 13, so that the expansion camera 22 is electrically connected to the main circuit board. The expansion camera 22 can be provided in the same direction as the main camera 12. The expansion camera 22 can be used in conjunction with the main camera 12 to capture the blind spot position of the main camera 12 and improve the shooting angle of the driving recorder 100. The expansion camera 22 can also be provided toward the inside of the car to capture the scene inside the car, thereby improving the flexibility of use of the driving recorder 100.

In the technical solution of the present application, an expansion interface 13 is provided in one of the main body 1 and the expansion component 2, and an expansion connector 23 is provided on the other. The expansion interface 13 and the expansion connector 23 are respectively and electrically connected to the main circuit board or the expansion circuit board at the corresponding position. The detachable electrical connection between the expansion interface 13 and the expansion connector 23 can realize the detachable electrical connection between the expansion circuit board and the main circuit board, and can also realize the detachable connection between the expansion component 2 and the main body 1. It is possible to flexibly select whether to connect the expansion component 2 according to the usage scenario, thereby improving the flexibility of use of the driving recorder 100.

In an embodiment of the present application, the main body 1 also includes a first magnetic component, which is provided at the inner wall of the housing 11 facing the expansion component 2. The expansion component 2 also includes a second magnetic component, which is provided at the inner wall of the base 21 facing the main body 1. The first magnetic component is magnetically connected to the second magnetic component to detachably connect the housing 11 and the base 21.

In this embodiment, the main body 1 and the expansion component 2 are respectively provided with a first magnetic component and a second magnetic component. The first magnetic component is provided within the housing 11, and the second magnetic component is provided within the base 21. When the housing 11 and the base 21 are close to each other, a magnetic attraction force will be generated between the first magnetic component and the second magnetic component, which can guide the expansion interface 13 and the expansion connector 23 to be plugged in. Through the magnetic force, the connection strength between the housing 11 and the expansion component 2 is improved to prevent the expansion component 2 from falling due to vehicle bumps.

In the embodiment of the present application, the main body includes two first magnetic members, the expansion component includes two second magnetic members, and the two first magnetic members or the two second magnetic members are spaced apart and provided at opposite sides of the expansion interface 13 or the expansion connector 23.

In this embodiment, the main body includes two first magnetic members, the expansion component includes two second magnetic members, and the two first magnetic components are spaced apart on the opposite sides of the expansion interface 13 or the expansion connector 23. Correspondingly, the two second magnetic components are spaced apart on the opposite sides of the expansion interface 13 and the expansion connector 23. When the housing 11 and the base 21 are close to each other, a magnetic force will be generated between the first magnetic components and the second magnetic components on both sides, which can guide the plugging of the expansion interface 13 and the expansion connector 23. In addition, through the magnetic connection between the two first magnetic components and the two second magnetic components, the connection strength between the housing 11 and the expansion component 2 can be further improved to prevent the expansion component 2 from falling due to vehicle bumps.

Figure 3:
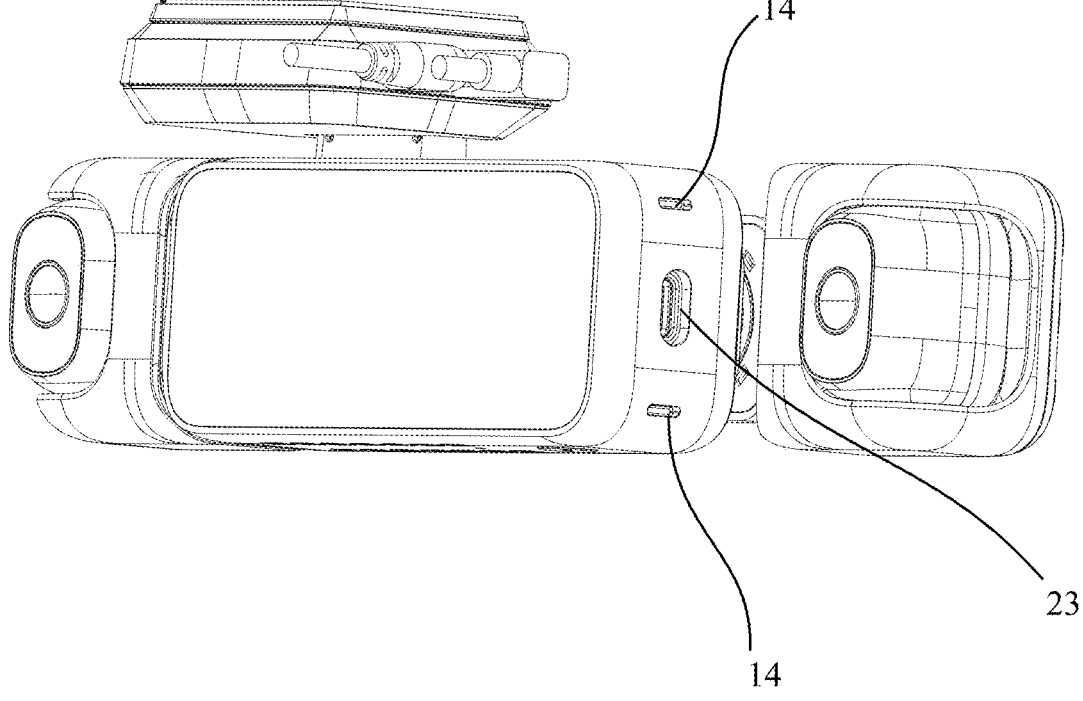
FIG. 3 is a schematic structural diagram of the driving recorder according to another embodiment of the present application.
Figure 4:
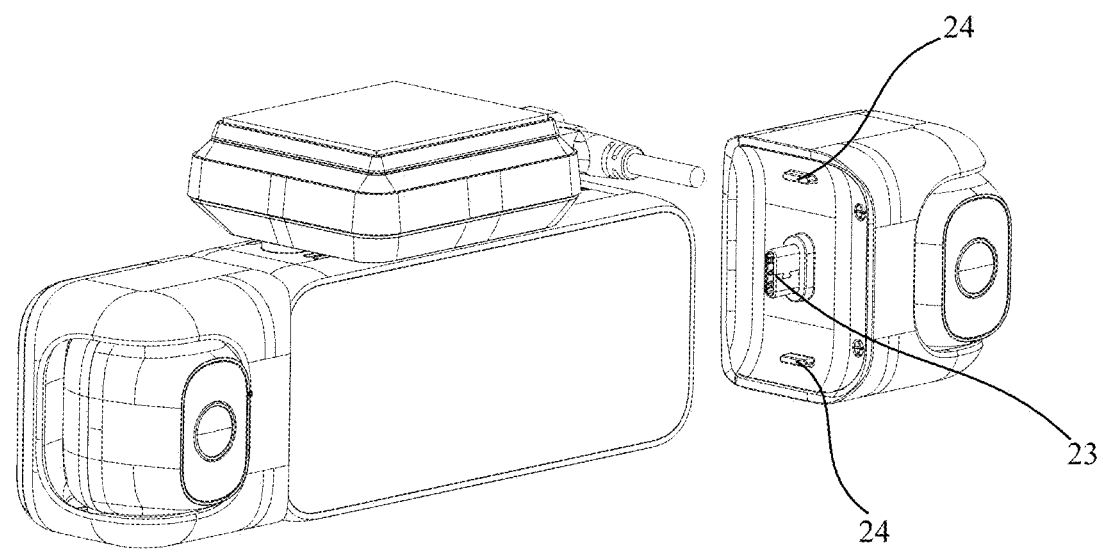
FIG. 4 is a schematic structural diagram of the driving recorder according to another embodiment of the present application.

In an embodiment of the present application, as shown in FIG. 3 and FIG. 4, a slot 14 is provided at the surface of one of the housing 11 and the base 21, and a plug-in part 24 is provided at the other. The plug-in part 24 is detachably connected to the slot 14 to detachably connect the housing 11 to the base 21.

In this embodiment, in order to further enhance the connection strength between the housing 11 and the base 21 and prevent the expansion assembly 2 from falling due to the bumps of the vehicle, causing the expansion camera 22 to fail to work, a slot 14 is provided at the surface of the housing 11 facing the base 21, and a plug-in part 24 is provided at the surface of the base 21 facing the housing 11, and the plug-in part 24 is inserted into the slot 14 to detachably connect the housing 11 to the base 21. In another embodiment, a plug-in part 24 is provided at the surface of the housing 11 facing the base 21, a slot 14 is provided at the surface of the base 21 facing the housing 11, and the plug-in part 24 is inserted into the slot 14 to detachably connect the housing 11 to the base 21.

In the embodiment of the present application, the quantity of the plug-in parts 24 and the quantity of the slots 14 are both two, and the two plug-in parts 24 or the two slots 14 are symmetrically provided at opposite sides of the expansion interface 13 or the expansion connector 23.

In this embodiment, the two plug-in parts 24 and the two slots 14 are symmetrically provided at opposite sides of the expansion interface 13 or the expansion connector 23, and one plug-in part 24 is inserted into one slot 14 to detachably connect the housing 11 and the base 21 to improve the connection strength.

In an embodiment of the present application, the expansion camera 22 is rotatably connected to the base 21. When the expansion component 2 is installed on the main body 1, the expansion camera 22 can be rotated in a horizontal direction relative to the base 21.

In this embodiment, when the expansion component 2 is installed on the main body 1, the expansion camera 22 can be rotated relative to the base 21 in the horizontal direction through the rotation connection between the expansion camera 22 and the base 21, thereby improving the shooting angle of the expansion camera 22 and enriching the use scenarios of the driving recorder 100. The specific rotation connection between the expansion camera 22 and the base 21 can be achieved by matching the shaft hole, or by the rotating bearing, which is not further limited here.

Figure 5:
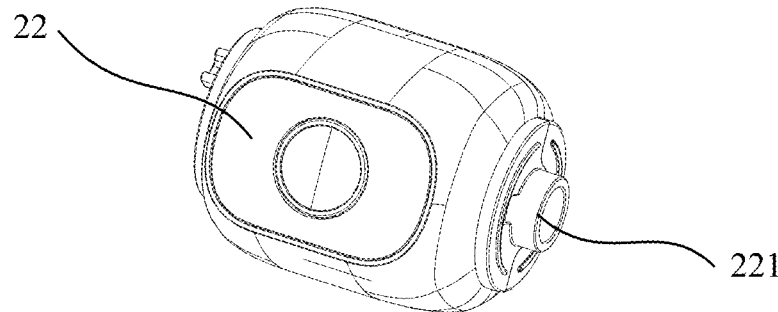
FIG. 5 is an exploded view of an expansion component in the driving recorder according to an embodiment of the present application.
Figure 5:
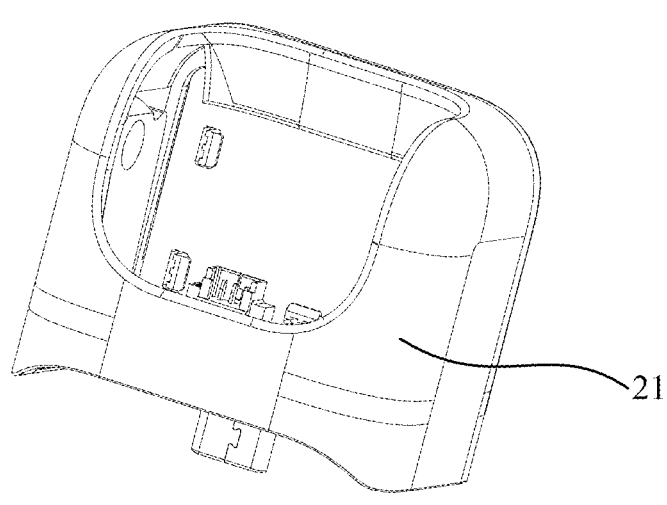

In the embodiment of the present application, in combination with reference to FIG. 5, a rotating shaft 221 is respectively provided at the opposite sides of one of the base 21 and the expansion camera 22. An axial hole is respectively opened on the opposite sides of the other one, and a rotating shaft 221 is passed through an axial hole to realize the rotation of the expansion camera 22 relative to the base 21 perpendicular to the extension direction of the rotating shaft 221.

In this embodiment, the specific connection method between the base 21 and the expansion camera 22 is through the shaft hole matching method, so that the expansion camera 22 can rotate relative to the base 21. The two opposite inner walls of the base 21 are respectively provided with a shaft hole, and the opposite sides of the expansion camera 22 are respectively provided with a rotating shaft 221, and a rotating shaft 221 is passed through a shaft hole to rotatably connect the expansion camera 22 to the base 21. It can be understood that in another embodiment, the two opposite inner walls of the base 21 are respectively provided with a rotating shaft 221, the opposite sides of the expansion camera 22 are respectively provided with a shaft hole, and a rotating shaft 221 is passed through a shaft hole to rotatably connect the expansion camera 22 to the base 21. Through the shaft hole matching method, the rotational connection between the expansion camera 22 and the base 21 is realized, and the connection strength between the expansion camera 22 and the base 21 is improved to prevent the expansion camera 22 from falling off from the base 21.

Figure 2:
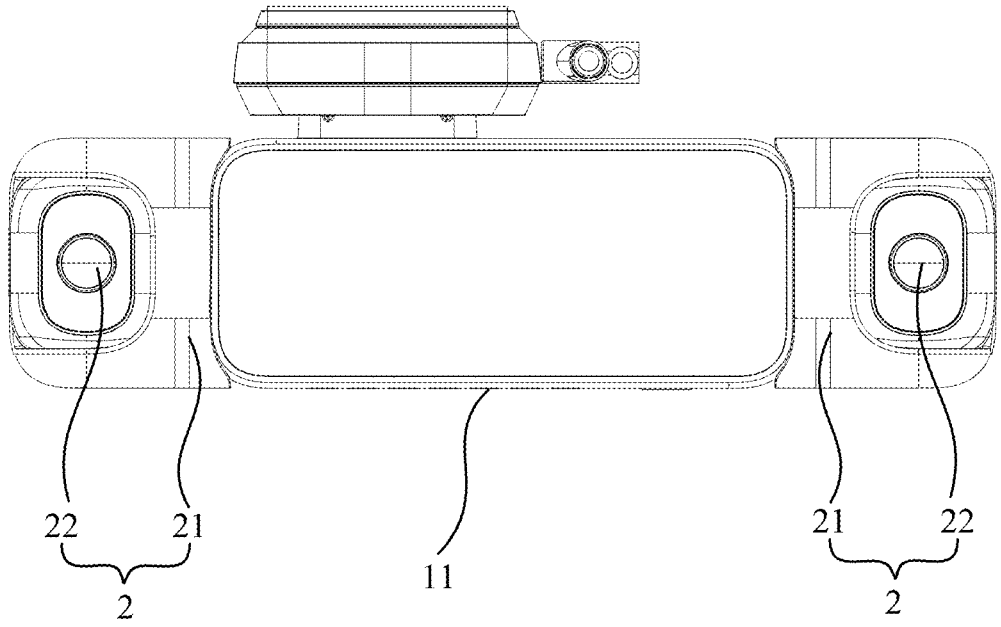
FIG. 2 is a schematic structural diagram of the driving recorder according to another embodiment of the present application.

In the embodiment of the present application, as shown in FIG. 1 and FIG. 2, the quantity of the expansion components 2 is two, and the two expansion components 2 are symmetrically provided at opposite sides of the main body 1.

In this embodiment, an expansion component 2 is provided at opposite sides of the main body 1, and expansion interfaces 13 or expansion connectors 23 are provided at opposite sides of the main circuit board of the main body 1. Corresponding expansion connectors 23 or expansion interfaces 13 are provided at the corresponding expansion components 2. One of the two expansion components 2 can be provided toward the front of the vehicle to help the main camera 12 shoot blind spots, and the other can be provided toward the inside of the vehicle. Alternatively, both can be provided toward the front of the vehicle to shoot toward both sides, respectively, to make up for the monitoring blind spots on both sides of the main camera 12, and further improve the shooting range of the driving recorder 100. The functionality of the driving recorder 100 can be further improved by the expansion components 2 provided at both sides.

In the embodiment of the present application, the expansion interface 13 is a Type-C interface and the expansion connector 23 is a Type-C connector.

In this embodiment, a Type-C interface and a Type-C connector are used as the expansion interface 13 and the expansion connector 23. Type-C supports blind insertion in both directions. It can be inserted smoothly regardless of the direction of the interface, which greatly improves the convenience of plugging and unplugging. The expansion camera 22 can also be selected to shoot toward the front of the vehicle or toward the inside of the vehicle according to actual needs, thereby improving the functionality of the driving recorder 100. In addition, the Type-C interface supports high-speed data transmission with a maximum data transmission speed of up to 10 Gbps, which can transmit a large amount of data in a short time and improve work efficiency.

The present application further provides a vehicle, including the driving recorder 100 as described above, where a power supply component of the vehicle is electrically connected to a main circuit board of the driving recorder 100.

In this embodiment, the main circuit board is electrically connected to the power supply assembly of the vehicle to provide power for the main camera 12 to operate, and through the electrical connection between the expansion connector 23 and the expansion interface 13, power can also be provided to the expansion camera 22.

The above are only some embodiments of the present application, and are not intended to limit the scope of the present application. Under the inventive concept of the present application, equivalent structural transformations made by using the contents of the description of the present application, or directly/indirectly applied in other related technical fields, are all included in the scope of the present application.

What is claimed is:

1. A driving recorder, comprising:
   a main body comprising a housing, a main circuit board, and a main camera; and an expansion component comprising a base, an expansion circuit board, and an expansion camera, wherein the main circuit board is provided within the housing, the main camera is provided at a surface of the housing, and the main camera is electrically connected to the main circuit board;

the expansion circuit board is provided within the base, the expansion camera is provided at the base and electrically connected to the expansion circuit board;

one of the main circuit board and the expansion circuit board is provided with an expansion interface, another one of the main circuit board and the expansion circuit board is provided with an expansion connector, and the expansion connector is detachably and electrically connected to the expansion interface to detachably connect the expansion component to the main body and to electrically connect the expansion circuit board to the main circuit board; and the expansion camera is rotatably connected to the base, and when the expansion component is installed on the main body, the expansion camera rotates horizontally relative to the base.

2. The driving recorder according to claim 1, wherein the main body further comprises a first magnetic member provided at an inner wall of the housing facing the expansion component; and the expansion component further comprises a second magnetic member provided at an inner wall of the base facing the main body, the first magnetic member is magnetically connected to the second magnetic member to detachably connect the housing and the base.

3. The driving recorder according to claim 2, wherein the main body comprises two first magnetic members, the expansion component comprises two second magnetic members, and the two first magnetic members or the two second magnetic members are spaced apart on opposite sides of the expansion interface or the expansion connector.

4. The driving recorder according to claim 1, wherein a slot is provided at a surface of one of the housing and the base, a plug-in part is provided at another one of the housing and the base, and the plug-in part is detachably connected to the slot to detachably connect the housing and the base.

5. The driving recorder according to claim 4, wherein a quantity of the plug-in parts and a quantity of the slots are both two, and the two plug-in parts or the two slots are symmetrically provided at opposite sides of the expansion interface or the expansion connector.

6. The driving recorder according to claim 1, wherein rotating shafts are provided at two opposite sides of one of the base and the expansion camera, axial holes are provided at two opposite sides of another one of the base and the expansion camera, one of the rotating shafts passes through one of the axial holes so that the expansion camera rotates relative to the base perpendicular to an extension direction of the rotating shaft.

7. The driving recorder according to claim 1, wherein the driving recorder comprises two expansion components, and the two expansion components are symmetrically provided at opposite sides of the main body.

8. The driving recorder according to claim 1, wherein the expansion interface is a Type-C interface, and the expansion connector is a Type-C connector.

9. A vehicle, comprising the driving recorder according to claim 1, wherein a power supply component of the vehicle is electrically connected to the main circuit board of the driving recorder.

* * * * *